United States Patent [19]

Henckels et al.

[11] 4,242,751

[45] Dec. 30, 1980

[54] AUTOMATIC FAULT-PROBING METHOD AND APPARATUS FOR CHECKING ELECTRICAL CIRCUITS AND THE LIKE

[75] Inventors: Lutz P. Henckels, Park Ridge; René M. Haas, Bloomingdale, both of N.J.; Alan Levin, III, Acton, Mass.

[73] Assignee: GenRad, Inc., Concord, Mass.

[21] Appl. No.: 937,430

[22] Filed: Aug. 28, 1978

Related U.S. Application Data

[63] Continuation of Ser. No. 660,824, Feb. 24, 1976, abandoned.

[51] Int. Cl.³ .............................................. G01R 31/28
[52] U.S. Cl. ................................. 371/26; 324/73 R; 371/15; 371/23
[58] Field of Search .......................... 235/302, 302.1; 364/200, 900; 324/73 R, 73 AT; 371/15, 26, 20, 23

[56] References Cited

U.S. PATENT DOCUMENTS

| | | | |
|---|---|---|---|
| 3,780,277 | 12/1973 | Armstron | 235/302.1 |
| 3,784,907 | 1/1974 | Eichelberger | 235/302 |
| 3,961,250 | 6/1976 | Snethen | 235/302 |
| 4,012,625 | 3/1977 | Bowen | 235/302 |

OTHER PUBLICATIONS

Millham and Patch, Logical Assembly Testing System, IBM Technical Disclosure Bulletin, vol. 14, No. 11, Apr. 1972, pp. 3446–3449.
Chao et al., Fault Isolations in Shift Register Latches, IBM Technical Discl. Bulletin, vol. 18, No. 4, Sep. 1975, pp. 1065–1067.
Wilcox et al., The Design and Implementation of a Table Driven, Interactive Diagnostic Programming System, Comm. of the ACM, Nov. 1976, vol. 19, No. 11, pp. 609–616.

Primary Examiner—Charles E. Atkinson
Attorney, Agent, or Firm—Rines and Rines, Shapiro and Shapiro

[57] ABSTRACT

This disclosure is concerned with a novel method and apparatus peripherally and interactively used with automatic fault detecting computer systems and the like, wherein external control is provided for introducing intelligence into the probing of circuit board nodes and the like where insights into predictable or likely failures are available and the over-riding or discontinuing of normal computer-guided time-consuming back-tracking probing is thus desirable.

12 Claims, 8 Drawing Figures

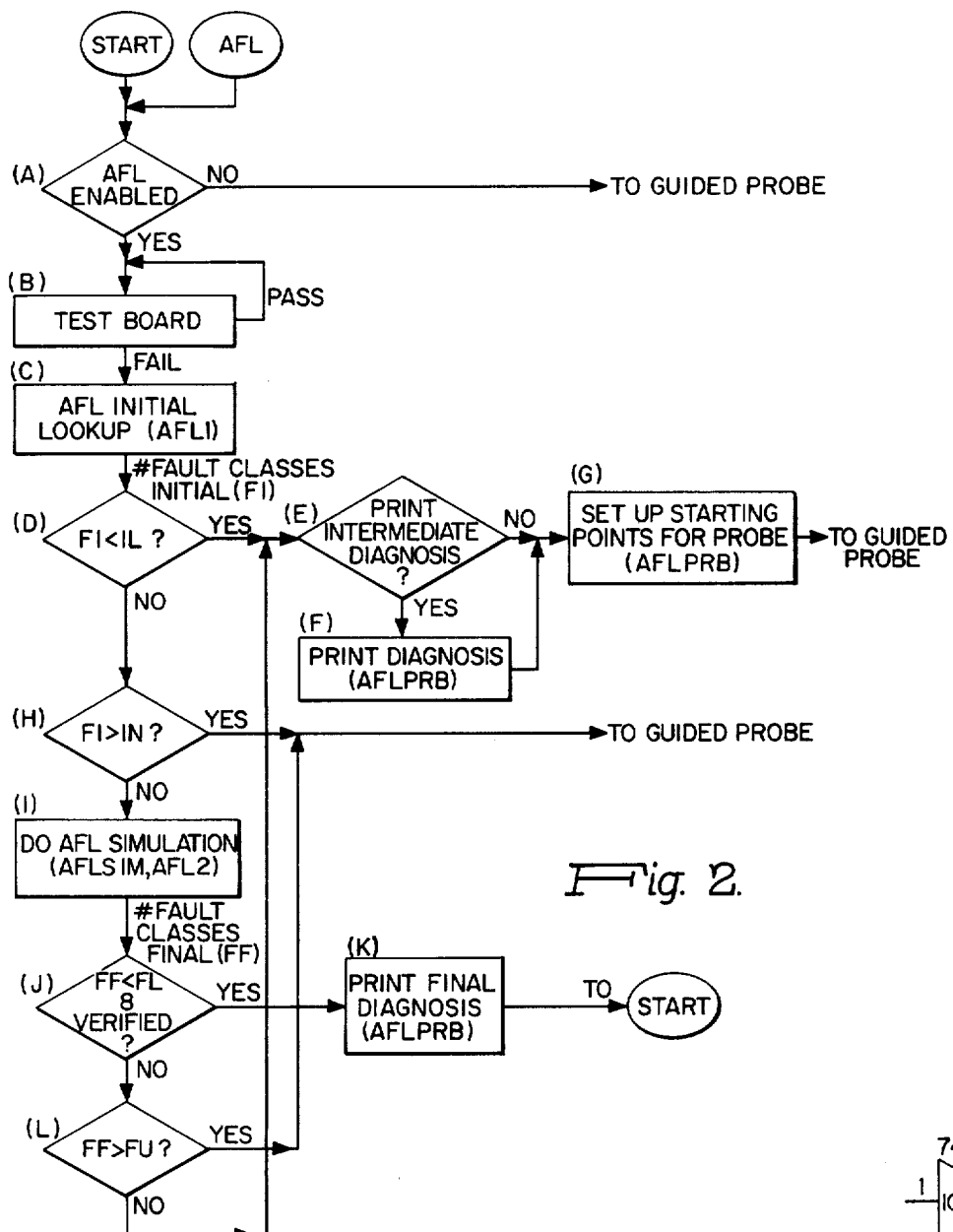
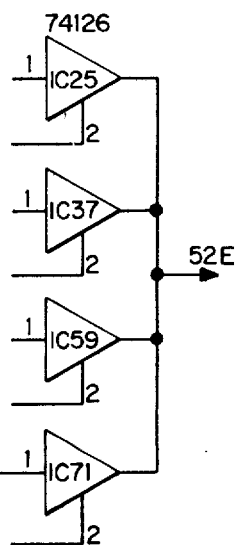
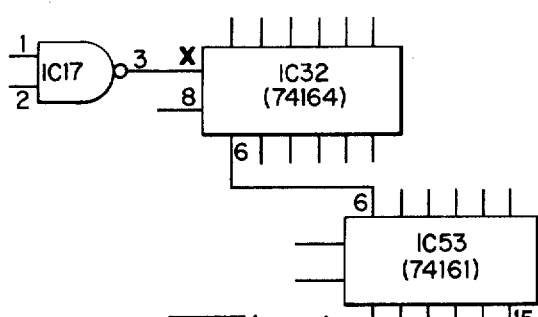
Fig. 2.
Fig. 1.

AUTOMATIC FAULT-PROBING METHOD AND APPARATUS FOR CHECKING ELECTRICAL CIRCUITS AND THE LIKE

This is a continuation application of Ser. No. 660,824, filed Feb. 24, 1976, now abandoned.

The present invention relates to improvements in automatic fault location in integrated circuits (IC) and logic circuit boards and the like, being more particularly directed to methods of and apparatus for the rapid and automatic diagnosis of faults in analog/digital and mixed logic circuit board units, preferably with the aid of a mini-computer as an element to be used in an overall system and method to enable on-line fault simulation.

In an article entitled "Automatic Fault Location Using On-Line Simulation" appearing in the IEEE Proceedings from the IEEE Intercon, 1974, and authored by coinventors Haas and Henckels herein, and in their related German patent publication Offenlegungsschrift No. 24 41 486, (corresponding to U.S. Pat. application Ser. No. 937,789, which is a continuation of Ser. No. 583,539, which in turn is a continuation of Ser. No. 443,853), and in the published manual "CAPS VII—Operating Instructions for CAPS Equipped 1972 Test Systems" (GR 1792A thru D Test Systems) April 1975, changed 1 Dec. 1975, of the assignee herein, General Radio Company, now GenRad, Inc. (all incorporated herein by reference), there are disclosed methods and apparatus that employ on-line simulation for automatic fault location. Such simulation generates only a small part of a complete fault dictionary needed for the diagnosis of a given board or unit under test (UUT), allowing the use as a component of an overall diagnosis system, or as some computational steps in an overall diagnosis technique or method, of a mini-computer-based automated test system equipped with only a small amount of secondary storage. Simple failures can thereby be accurately diagnosed by an "exact match" with modeled failures, while a heuristic approach allows for a "partial match" of faulty behavior, leading to a highly probable diagnosis. The technique of the above patent reference and CAPS publications involves preparing a partial fault dictionary of modeled faults of a circuit unit and storing the same as electrically retrievable responses; subjecting such a circuit to an on-line set of tests; comparing the responses to the tests of the tested circuit with responses of a good circuit to detect variations, if existent, from the good circuit responses, indicative of faults; passing the tested circuit as good in the absence of such variations; responding to detected variations of extract from the stored partial dictionary a list of possible faults; simulating on-line the faults from said test; and comparing the responses of the faulty circuit under test with the responses of the simulated faults to effect fault diagnosis of the circuit unit under test.

In addition to automatically diagnosing logic failures by simulating possible fault mechanisms on-line, such systems may employ a computer-guided probe to complement the operation of the automatic fault location approach and isolate faults by tracing a bad signal back to its source without any assumptions concerning the nature of the failure.

Since the present invention relates to improvements particularly in the area of the guided probe, providing a new and improved method of and system for making such guiding "intelligent" or "smart", as hereinafter fully described, it is not deemed necessary to repeat in detail the overall system descriptions or drawings which are contained in the above-cited materials and are therefore incorporated by reference herein. Those skilled in this art will readily appreciate the improvement invention and implementation herein without the necessity for such repetition, which would not be directed to the novelty herein-described and could detract from the clarity of the description of, and emphasis upon, the present invention.

In the context of the above-described type of equipment, thus, two tools have been available for diagnosing manufacturing faults on digital printed circuit boards; namely, the fault-dictionary approach and the tracking computer-guided probe. Each approach has demonstrated major advantages and has been developed into a powerful automatic tool for fault diagnosis. At the same time, each approach has weaknesses which are particularly severe when isolating failures on complex boards containing many MSI and LSI chips. In particular, the fault dictionary frequently does not pinpoint a fault to a single IC pin. The probe often may take ten to fifteen minutes to track down a fault on some complex board units. In accordance with the present invention, as later made more evident, a new diagnostic technique is provided that combines advantages of both approaches and incorporates several other new cost-saving capabilities, enabling the pinpointing of faults to a single IC node in a minute or two on nearly any type of digital circuit card, and even on some analog/digital circuit boards—a so-called "smart probe" diagnostic improvement.

One of the principal advantages of the fault-dictionary approach is the speed with which the diagnosis is made, almost independent of circuit size or complexity; with faults being diagnosed within a matter of seconds and without any operator intervention. This technique has proven itself particularly powerful on boards with a high degree of visibility; that is, on boards with one or more external output pins per IC. Often this visibility is only achieved by use of a bed-of-nails" for a test fixture. Such systems are described, for example, in the following publications: Ernest T. Collins, "Fairtest—A System for Computer-Aided Design of Test Programs for Digital Logic Modules," 1973 *Wescon Professional Program*, Session 10; and Robert M. McClure, "Fault Simulation of Digital Logic Utilizing a Small Host Computer," *Proceedings—9th Design Automation Workshop*, 1972. The automatic on-line fault simulation improvement, previously mentioned and referenced, significantly improves diagnostic resolution by comparing responses from the unit under test (UUT) with the simulated responses of failing circuits for the entire length of the test program.

But even this improvement can not completely overcome the inherent limitations of this type of technique. Since a diagnostic system using the fault-dictionary approach cannot know the states of internal IC nodes on the UUT, it frequently is unable to resolve faults down to a single IC pin. A simple nand gate, for example, having four input pins (1, 2, 3, 4) and an output pin (5) demonstrates this inherent weakness.

By observing only the logical values at the output pin 5, the fault dictionary cannot distinguish between the following five faults: pin 5 stuck high, pin 1 stuck low, pin 2 stuck low, pin 3 stuck low, and pin 4 stuck low. Thus, even for such a simple IC, five IC nodes must be listed in the final diagnosis if the output is stuck high. If it takes an operator about two minutes to follow a printed circuit track in search for a possible short, then ten minutes may be spent to pinpoint the trouble on the nand gate, even though it took only five seconds for the system to identify the fives nodes. Thus the poor resolution of the fault dictionary can be costly.

In addition to poor resolution, moreover, the fault dictionary may have no entry for a particular combination of faults on any given board. Even with the improved on-line simulation technique, there will always be some static and many dynamic faults that cannot be identified at all. A good rule of thumb for the beforementioned CAPS VII systems, for example, is that, for a 100-IC circuit board, about 95 percent of all manufacturing faults will be correctly diagnosed to within about three IC nodes. This may be worse for some sections of logic with particularly poor visibility, depending on the testability of the circuit design (David Schneider, "Designing Logic Boards for Automatic Test," *Electronics*, July 25, 1974).

Because of the above problems, many users prefer the approach of the previously mentioned tracking computer-guided probe. Such techniques are described, for example, in the first-mentioned references and also in the following publications: F. David Patch et al, "Real-Time Diagnosis of Logic Assemblies," 1970 *Workshop on Fault Detection and Diagnosis*, Lehigh University, PA, 1970; and Noel P. Lyons, "Faultrack, Universal Fault Isolation Procedure for Digital Logic," *IEEE* 1974 *Intercon*, Session 40. Since the probe can interrogate any internal IC node, it is always capable of pinpointing a fault down to a single IC node, except for some rare feedback situations. The primary disadvantages of the probe, however, are that it is slow, because of the frequently large number of point which must be probed, and that the probability of error is high, because of the extent of the operator intervention required. It is interesting to note that these major disadvantages and advantages of the tracking computer-guided probe are exactly opposite to those of the fault-dictionary approach. For this reason, the judicious union of the two approaches creates a much more powerful tool for diagnosis.

In order to overcome the difficulties inherent in the fault-dictionary and tracking-probe approaches, thus, the present invention involves the development of a new technique that takes advantage of the strengths of both approaches by automatically linking them. The resulting look-ahead computer-guided "smart" probe of the invention possesses the following features:

(a) reduction of time to diagnose failures typically by a factor of three to four over the tracking computer-guided probe;
(b) accurate diagnosis of failures to a single IC node;
(c) automatic setup as a by-product of the test-program generation process; and
(d) low storage requirements.

The look-ahead computer-guided probe of the invention, moreover, makes use of a partial fault dictionary, detailed in the first cited references, above, to supply predictions of fault location, based on the failing behavior of the UUT. Instead of tracking the faulty behavior back from the edge connector (external output), however, the system automatically instructs the operator to probe the point at which a fault is predicted.

The present invention, therefore, has as one of its objects the provision of a new and improved method of and system for automatic fault detection of the character described that imbues the basic computer guided probe with "intelligence"; i.e. user starting and jumping points for test and in-line interaction, determined from prediction.

A further object is to provide such a novel method and system that employ, as a part or component thereof, the power of mini-computer techniques and enable fast, accurate and automatic diagnosis of faulty behavior in complex circuits without requiring highly skilled personnel.

Other and further objects will be explained hereinafter and are more particularly delineated in the appended claims. In summary, however, the overall method in one of the aspects of the invention, involves testing the UUT; from its results, making a failure prediction; directing the probe to the predicted point, and if it is bad, tracking the failure from there, or making a second more accurate prediction; and, using a combination of predicting bad points and tracking bad points, to cause the probe finally to isolate the fault to a simple IC pin or circuit node or the like. Preferred details are later explained.

The invention will now be described with reference to the accompanying drawings, FIG. 1 of which is a circuit block diagram of an illustrative electronic circuit to be tested in accordance with the invention;

FIG. 2 is a combined block diagram and flow chart of a preferred form of the invention;

Figure 3:
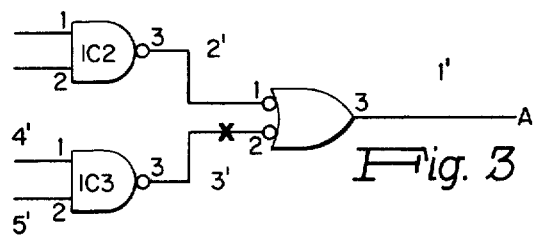
FIGS. 3 through 7 are circuit block diagrams of various circuit configurations and testing points.

The philosophy underlying the technique of the invention may perhaps best be illustrated at the outset by reviewing the more conventional tracking-back probe procedures, referring to the illustrative example of FIG. 1 showing an input gate IC17, an electronic counter IC53, a shift register IC32, and a plurality of output bus drivers IC25, 37, 59 and 71.

Suppose that there exists an open connection between IC17.3 (IC17, pin 3) and IC32.8, (IC32, pin 8). To find the fault by a conventional tracking-probe method, the bad behavior must be traced back from the external output 52E, through the bus drivers, the 74161 counter, and the 74164 shift register. Even in this simple case where the fault lies only three logic levels back from the edge connector, the operator must probe 21 points to isolate the fault, as shown in the following probing sequence:

52E, Bad At Test 620/Failing Sensor Pin/Start Tracking Back From 52E
Probe IC25 3; Bad At Test 620
Probe IC25 1; Good
Probe IC25 2; Good
Probe IC37 1; Good
Probe IC37 2; Good
Probe IC59 1; Good
Probe IC59 2; Good
Probe IC71 1; Bad at Test 620
Probe IC53 1; Good
Probe IC53 2; Good
Probe IC53 3; Good
Probe IC53 4; Good
Probe IC53 5; Good
Probe IC53 6; Bad At Test 250
Probe IC32 1; Good
Probe IC32 2; Good Probe IC32 8; Bad At Test 70
Probe IC17 1; Good
Probe IC17 2; Good
Probe IC17 3; Good
Probe IC32 8; Bad At Test 70/Verify Final Diagnosis Point With the look-ahead probe of the invention, diagnosis may be initiated by a fault-dictionary lookup. Typically, this lookup yields several possible predictions of fault location. For example, in the above case, IC53.6, IC32.8, IC17.1, IC17.2 and IC17.3 may all be cited as possible locations of the failure. Instead of displaying this information to the operator, however, the system now instructs him to probe these predicted points, until it finds a point whose nodal values disagree with the values which would be present on a good board. From that point on, it tracks back to verify the failing node. In the example given above, the probing sequence would be as follows:

52E; Bad At Test 620/Failing Sensor Pin
Probe IC53.6; Bad At Test 250/Fault Dictionary Lookup Point
Probe IC32.1; Good
Probe IC32.2; Good
Probe IC32.8; Bad At Test 70
Probe IC17.1; Good
Probe IC17.2; Good
Probe IC17.3; Good
Probe IC32.8; Bad At Test 70/Verify Final Diagnosis Point The first point probed was found "bad"; in other words the logical values at that point did not match good circuit values for all tests in the board test program. The fault, therefore, must lie on that node or a path back from that node. From this point on, thus, the probing sequence is identical to that of the tracking computer-guided probe.

By starting at the fault-dictionary predicted point, however, even in this simple example, the number of points to be probed has been markedly reduced from 21 to 8. Since fewer points need be probed, in addition to saving time, the probability of an error due to misprobing has been decreased. Thus, the look-ahead probe is not only faster than the tracking probe but also more accurate, because of fewer operator errors. Since, moreover, the algorithm used by the look-ahead probe to make the final diagnosis is the same as that for a tracking probe, the diagnostic system will always isolate a fault down to a single IC pin or circuit node, except for a few rare asynchronous feedback loop failures. Like the tracking probe, the look-ahead computer-guided probe is independent of the fault mode used to evaluate the test program. Any time the UUT fails the test program in any way, a fault-dictionary search is initiated. In the unusual case that no match or near-match with the bad board behavior can be found, operation of the system automatically reverts to a standard tracking technique.

In the typical manufacturing case of multiple failures, the look-ahead technique has been found to be highly successful for several reasons. Experience has shown that, in the overwhelming majority of the cases, multiple faults make themselves known one at a time in a test program. Thus a fault dictionary will predict the location of the fault that causes the first failure in the test program. After the probe has pinpointed the failure and repair has been effected, the board is retested and the next fault is diagnosed. This process continues until all faults are eliminated and the circuit passes the test. Finally, if several faults strongly interact to fail in a way that is not characteristic of any one of the faults individually, the worst that can happen is that none of the probing points suggested by the fault-dictionary lookup is indeed on a faulty path. When this happens, the look-ahead probe again automatically traces its way back from the failing edge connector, maintaining the information of which paths the fault does not lie on, in order to avoid reprobing those points.

In all cases, however, the operational strategy of the look-ahead probe is completely transparent to the operator of the system. The only actions which the operator performs are touching the probe to the IC pin displayed on a video terminal and depressing a foot switch.

Any system that performs an automatic or semi-automatic diagnosis of complex logic circuitry involves some setup cost. Fortunately, in the case of the "smart probe", which is part of the CAPS test generation, evaluation and diagnostic software system, accumulation of nodal status data and fault-dictionary information is performed automatically as a by-product of the test generation and evaluation process. Thus, after a test technician has successfully generated an effective test plan, the system is immediately ready to diagnose circuits automatically.

The look-ahead probe, then, provides an effective solution for diagnosing digital circuits. For a high-volume production environment, however, there are several issues that should still be addressed. For example, how can the diagnostic system be optimized in its handling of a circuit's most common failure modes? The "smart probe" of the invention incorporates several novel features besides the fault-dictionary look-ahead, which further enhance its diagnostic capabilities and also permit automatic handling of mixed analog/digital and mixed logic family boards.

The user-programmed look-ahead feature of the invention allows the test technician to specify points to be checked on the basis of particular failure conditions. For example, in the case of the circuit of FIG. 1, let it be supposed that the connection between IC17.3 and IC32.8 is made by a jumper that often makes poor contact and is therefore a frequent cause of failure. With a simple one-line statement, the technician can easily and quickly add this knowledge to the diagnostic system. Subsequently, whenever the circuit fails on sensor 52E at the test specified, the system will instruct the operator to probe the jumper connection first. The probing sequence in this example would be as follows:

52E; Bad At Test 620/Failure Sensor Pin
Probe IC32.8; Bad At Test 70/User Programmed Starting Point
Probe IC17.1; Good
Probe IC17.2; Good
Probe IC17.3; Good
Probe IC32.8; Bad At Test 70/Verify Final Diagnosis Point Many such user-programmed probe starting points can be added to the diagnostic data for a given circuit type, so that, depending on the failing conditions, the most common causes of these conditions can be checked immediately. Since the test system can retain the experience of a seasoned operator, efficient diagnosis of complex circuits no longer depends on personnel who have become intimately familiar with the circuits under test. Production test facilities can thus maintain a constant high level of throughput in spite of personnel changes.

Another important application of the user-programmed look-ahead feature allows the computer-guided probe to diagnose automatically digital faults that make themselves known only through the failure of analog tests. Consider, for example digital circuitry driving a digital/analog converter (D/A) with only its outputs directly observable by the tester. Given that the digital logic which determines the input to the converter is rather complex, a failure sensed on the converter's outputs is most probably due to a fault inside the digital part of the circuit. If the test technician programs a set of probe starting points at the digital inputs, the system will automatically check these inputs whenever the analog test for the D/A fails. Subsequently, the system will diagnose the failure in the digital circuitry. Only if all the inputs of the D/A are good will the system indict the D/A converter as cause of the failure. Thus, the diagnostic system can easily be programmed to locate automatically many failures on mixed analog/-digital boards.

In spite of all the automated means provided to isolate failures, it is occasionally desirable for an operator to guide the probe himself, by interactively specifying which points he wishes to probe and letting the system analyze the data from these points. This interactive mode of operation developed for the "smart probe" permits the operator to suggest the location of a fault on-line; that is, at the time a board is tested. He does this by typing the IC name and pin number of the point he wishes to probe. In turn, after he has probed the point, the system informs the operator on whether the point was good or bad. With this information, the operator may suggest another point or return full control, at the touch of a button, to the computer-guided probe. All the points probed interactively will be used in making the final diagnosis. If any failing nodes have been probed interactively, the system checks the inputs to these nodes. If these inputs are "OK", the system diagnoses the fault at the operator-specified point. Otherwise, it traces back to the source of the fault with the standard tracking technique.

Interactive on-line look-ahead is most often useful when the operator has an excellent idea of where the fault lies and wishes the system to verify his hunch. Then, if the problem is one that recurs on any boards, he can permanently program the look-ahead point into the system, so that the system automatically performs this look-ahead in the future.

Finally, the "smart probe" feature of the invention may incorporate the capability of automatically varying the probe-sensor threshold values, depending on the logic family of the point currently being probed. Thus it may recognize valid logic 0 and 1 levels for different families on mixed logic circuit boards, such as those which use combinations of TTL, MOS and CMOS technologies. Determination of the logic family of each node in the circuit is made automatically as part of the test-generation and evaluation process, so the technician is freed from the laborious task of programming the threshold values for each node.

At testing time, such automatic switching of threshold values on the probe, regardless of the mode of operation, eliminates the need for physical switches on the probe itself, which are subject to operator error. With the mixed-logic nature of a board completely invisible, the operator can thus troubleshoot it as easily as if it were a single-logic family digital circuit.

Figure 8:
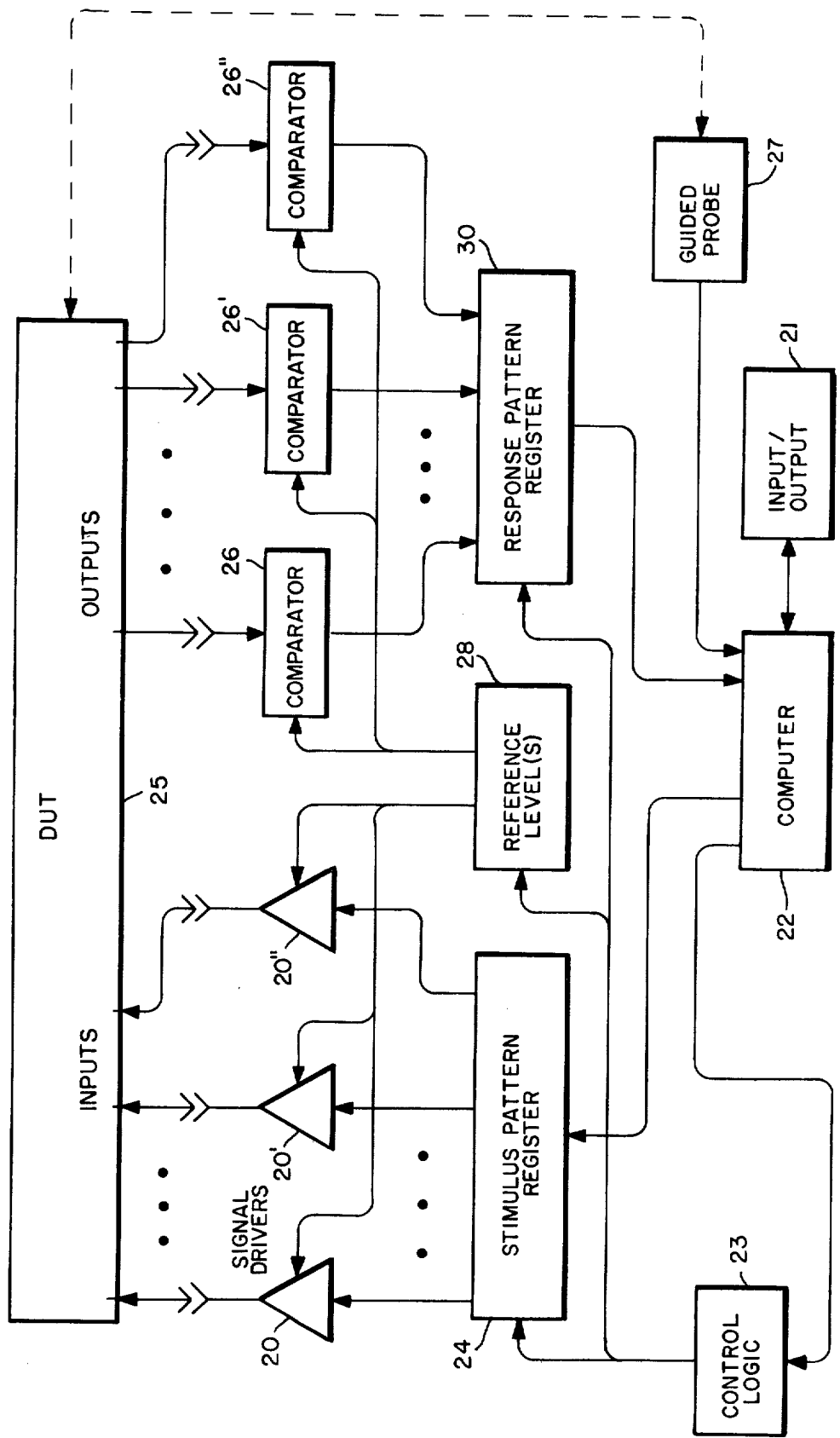
FIG. 8 is a diagrammatic view illustrating an automatic on-line computer-aided fault diagnosis system in accordance with the invention.

Turning, now, to the generalized automatic fault location (AFL) mode of testing, reference is made to the summary system block diagram and flow chart of FIG. 2 illustrating a process in accordance with the invention which may be implemented, for example, in the automatic fault diagnosis system illustrated in FIG. 8, which may be similar to the above-mentioned CAPS VII equipment described in the referenced patent applications and publications. The use of the START or AFL buttons in FIG. 2 causes a transfer to the beginning of the flow chart [A]. If AFL is enabled, then board testing can occur with the board unit externally or peripherally connected to the system at [B] as later described. If AFL is not enabled, then AFL is not used and the enabling of the guided probe mode is checked.

Testing is performed at [B] by a module involving the test board, as described in the Haas and Henckels publication and patent references, above. If the START button was originally hit to reach [A], then testing is started automatically with the module (called AFL1) looking up in the fault dictionary at [C] which predicted faults could be responsible for the failure. For discussion purposes, the number of such faults will be signified by the variable FI. The AFL initial transfer limits are then used in [D] and [H] to effect transfers to the probe with or without starting points, or to continue to AFL simulation. If the number of fault classes (FI) is less than the initial lower limit (IL) (i.e. FI<IL), then a transfer to the guided probe with starting points is indicated [D]. First, however, the state of the print intermediate diagnosis is checked at [E]. If it is ON, then the faults concerned are displayed by the AFLPRB module [F]. Whether these intermediate faults are printed or not, starting points for use by the guided probe are prepared at [G] by the AFLPRB module before transfer to the guided probe. If, on the other hand, the number of initial fault classes (FI) is greater than the initial upper limit (IN), then a direct transfer to the guided probe is made without preparing starting points [H].

Should neither of these limits cause a transfer to the guided probe, however, then AFL simulation [I] is performed by module AFLSIM. Module AFL2 then classifies the number of faults based on the simulation results (FF is the number of faults accepted by AFL2). If the number of faults is less than the final lower limit (FL) and the faults exactly match the faulty operation [J], then a final diagnosis is printed at [K] and the overall testing process is restarted.

In the event that the number of fault classes is greater than the final upper limit (FU) at [L], then a direct transfer to the guided probe without starting points is made. If both final limit checks fail, the sequence of transferring to the guided probe with starting points [E, F, and G] is then taken.

In initial AFL lookup (box [C] in FIG. 2) is performed by a module termed AFLI. The lookup uses two pieces of data from the DUT (device or unit under test) testing: the failing test number and the failing vector. That is, the test program step at which a failure first occurs and a list of the driver/sensors which failed at that test.

The prepared fault dictionary is then used. This dictionary holds data about how each modelled fault should be detected and is organized first by step number, then by failing vector. Thus, at testing time, the entries in the fault dictionary for the DUT's failing test are extracted. Only those entries whose failing vectors match the DUT's failing vector are considered possible causes of the DUT's failure, as explained in said CAPS VII publications and the referenced patent applications.

In other words, the fault dictionary lookup pulls out those modelled faults which, in simulation, failed at the same step and in the same way as the failing DUT. This process serves to narrow down the number of faults possibly responsible for a particular DUT's failure from hundreds or thousands to ten or less. In some cases the resolution at this point might be quite good—that is, the number of possible faults is small due to the fact that different faults manifest themselves in different ways. In other cases, where the DUT fails early in the test program or few outputs from the board are visible, the resolution may be poorer and require AFL simulation to narrow down the number of possible faults.

The AFL simulation process, moreover, is much like the fault simulation. Faults are inserted in the simulation model of the DUT and the operation of the faulty DUT is simulated. While in preparing, the fault dictionary model's simulation is compared against the simulation of the good (non-faulty) network for the purpose of determining fault detection; in the AFL simulation, the faulty model's simulation is compared against the actual faulty operation of the DUT. If a faulty model's simulation matches the DUT operation, then the modelled fault is verified as being responsible for the actual DUT failure. Any fault the model simulation of which does not exactly match the faulty DUT cannot be solely responsible for the DUT failure. The AFL process, however, inserts only one failure per model, whereas there can exist two, three or more actual failures on a DUT.

It is possible, then, for a modelled fault to be present on a faulty DUT but in some way mis-match the DUT operation. This is most likely due to one or more additional failures which contribute additional failing tests or which modify the behavior of the first failure. In addition, the mis-match may be due to a non-logical failure; that is, a failure which causes the DUT to behave in a random, unpredictable manner. Examples of this latter category are: a short across an inverter which causes a fast oscillation; or a short resulting in an overload which causes a threshold voltage situation.

AFL simulation utilizes a sophisticated technique which measures the probability that a modelled fault is somehow responsible for a DUT failure. This technique results in one of three types of diagnosis: "verified", "verified but others", and "probable". "Verified" indicates that the modelled fault exactly matches the DUT faulty operation. "Verified, but others" indicates that the modelled fault failures with respect to a good DUT are a subset of the faulty DUT failure. This means that the fault(s) indicated in the diagnosis are present on the DUT, but that one or more additional faults are present. These extra faults will be diagnosed only after the fault(s) in the current diagnosis are removed. "Probable" indicates that the modelled fault failures were not a sub-set of the DUT failures but were close enough so as to indicate that the fault is "probably" present.

In accordance with the present invention, it may be desirable to transfer to the guided probe after initial lookup or after AFL simulation. When the number of fault classes after initial lookup is small, it may be faster to let the guided probe check these fault classes out rather than proceed on to AFL simulation. That is, rather than have AFL simulation narrow down the number of faults, the guided probe may probe the fault classes indicated and thereby determine where the actual failure lies. The invention provides for instructing the guided probe as to where to probe initially, based on the fault classes under investigation, by selecting one node from each fault class. A fault class is a group of one or more individual faults (stuck at zero, stuck at one, short to another pin) which are indistinguishable as observed from the external behavior of the DUT. Although the guided probe can look at any one of the pins included in a fault class, it must be given a single point to look at; one which will be bad if any of the individual faults in the fault class is present. When so instructed, the probe first looks at the points given it. If any of these points is bad, the guided probe follows its normal mode of isolating a failure—but starts at the bad point. This is a great advantage over the normal guided probe start-up procedure which involves tracing back from a failing external output, as before described. Thus the guided probe is intelligently instructed to jump immediately to the area of failure, often saving many minutes of probing.

FIG. 8 illustrates a preferred form of an automatic fault diagnosis system in accordance with the invention for performing the previously described process. The system of FIG. 8 is similar to the automatic fault diagnosis system described in detail in the referenced copending application Ser. No. 937,789 and illustrated in FIG. 3 thereof, but with the addition of a guided probe (block 27) and the addition of an Input/Output block 21 in place of the Input Stimuli: Data block 1. As shown, the system includes a computer 22, which may be a minicomputer such as the Digital Equipment Corporation PDP-8E. An input/output device 21 (which may include a conventional display and keyboard) is connected to the computer to enable communication between an operator and the system. A circuit unit or device under test (DUT) 25 is connected to the system by means of a plurality of signal driver amplifiers 20, 20', 20" connected to the DUT inputs, and by means of a plurality of comparator circuits 26, 26', 26" connected to the DUT outputs. The signal driver amplifiers are connected to the computer by means of a stimulus pattern register 24, which may be a conventional latch-type storage register. The comparator circuits are similarly connected to the computer by means of a response pattern register 30, which may be similar to register 24. A reference level generator 28 is connected to the signal driver amplifiers and to the comparator circuits to enable their logic levels to be appropriately adjusted in accordance with the particular type of circuit logic being tested. The computer controls registers 24, 30 and reference level generator 28 by means of control logic 23. In accordance with the invention, the computer is also provided with a guided probe 27 for probing internal nodes of the DUT and providing the signals on these nodes to the computer.

As described in the referenced copending application, the DUT is provided with input signals from signal driver amplifiers 20, 20', 20", etc., which receive the data of a given test from the stimulus pattern register 24. The test data is conventionally sequenced by computer 22, which loads the data into the stimulus pattern register 24. The output responses of the DUT are compared by respective comparators 26, 26', 26", etc. with reference levels 28 to determine the logical states of the outputs of the DUT, the aggregate of which is the response pattern. This pattern is stored in the response pattern register 30 and thence read into computer 22, where the DUT responses are compared with the responses of a good circuit unit in a well-known manner, such as described in the Digital Equipment Corporation Handbooks "Introduction to Programming" and "PDP-8E & PDP-8M Small Computer Handbook."

In accordance with the invention, when variations between the responses of the DUT and the responses of a properly operating circuit unit are detected, the computer performs the previously described process illustrated in FIG. 2, wherein the most likely internal failing nodes of the DUT are predicted and successive predicted internal failing nodes are indicated to the operator on the display of input/output device 21 for probing. The operator then successively probes each of indicated nodes, and the computer compares the signal values on the probed nodes with those of a properly operating circuit unit in order to identify a failing node. If none of the predicted nodes probed turns out to be a failing node, the computer than indicates successive nodes to be probed by back-tracking node-by-node from an external output node of the circuit unit, until the failing node is identified.

As will be explained hereinafter and as will be appreciated by those skilled in the art, the computer permits a great deal of flexibility to be built into the system. Moreover, the system may be modified easily to accommodate various options and additional functions as will be described below.

Having described the background workings of such automatic fault detection systems, as detailed in the earlier referenced publications, it is now in order to present specific examples of the flexibility attainable with the method underlying the invention, referring for further details to papers presented by coapplicants Haas and Henckels "The Smart Probe—A New Diagnostic Tool" before the National Electronic Packaging and Production Conference and before WESCON in June 1975.

It is first available to select to use the basic algorithmically straight-forward approach. Starting from a failing external output, the probe will normally track backwards, bad-circuit node by bad-circuit node, until it comes to a point where the output of a logic gate is bad, but all the gate inputs are good. This, then, is the point of board failure. FIG. 3 shows that, tracking back from failing external output "A," the probe algorithm will check node 2' and, upon finding it good, will ask to "see" node 3'. Since it will find node 3' bad, and nodes 4' and 5' good, it can diagnose the failure at node 3'.

Figure 4:
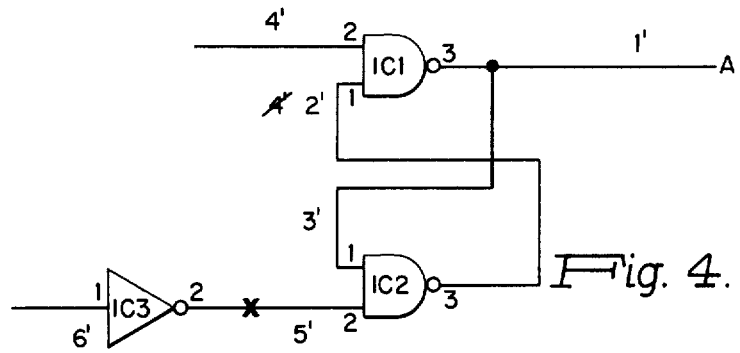

In order to insure that the algorithm works in all cases, provisions for handling feedback loops are included. It is essential that once a feedback loop is entered, no diagnosis is made until all possible "exit paths" from the loop have been examined. The example of a simple latch is presented in FIG. 4, illustrating the general problem. Looking at nodes 1' (corresponding to failing external output "A"), 2' and 3', if there exists no feedback detection mechanism, the algorithm would next try to look at node 1* thus entering an infinite loop of requests to probe the same two nodes repeatedly. If, on the other hand, the feedback detection mechanism tried to diagnose the fault after node 3' had been checked, the tracking probe would have generated an incorrect diagnosis—since all "exit paths" had not been examined. The correct implementation requires that nodes 4', 5' and 6' be examined so that a correct diagnosis at node 5' can be made. Extending this technique to the general feedback problem guarantees that the basic computer-guided tracking probe algorithm can diagnose the proper failure.

It will be evident that the basic probe algorithm forms a strong foundation upon which to build an extensible probe system. The "black-box" used need not be concerned with details of either the inner workings of the probe or the specific UUT. The user need only follow the probe's request for nodes to be probed to guarantee an accurate diagnosis. Conversely, extended capabilities can easily be added for the sophisticated user. This is because the user can easily understand the basic algorithm and thus how it will be affected by his actions, and because the basic algorithm always provides a point to which to return if what the user was attempting proved unsuccessful. The major drawback of implementing only the basic algorithm becomes obvious on those UUT which are "deep"; i.e. those having many levels of logic between their external inputs and outputs. In the case of a UUT composed of complex ICs, such as counters or shift registers, it would not be uncommon to probe four or five nodes per logic level. Given six or more levels of logic from external output to fault, the number of individual nodes to be probed for a given failing UUT rises above 30. The most important feature of the implementation of the added capabilities is the reduction of the number of individual nodes to be probed.

As before explained, starting points can intelligently be created for the probe. A first capability that can be added to the base system is the use of the fault-dictionary lookup which, as previously explained, provides starting points for the tracking probe, internal to the board. In its simplest implementation, the fault dictionary associates the location of the fault with the first failing test in the test program, and the failing external output signature at that test. Thus, when a UUT fails, all faults in the dictionary which cause first failures at the same test stop as the UUT with the identical failing signature can be passed to the probe as starting points. The probe will then select the first starting point and request that it be probed. If this point is good, the probe will proceed to the next suggested starting point. As soon as a bad point has been detected, the system enters the basic tracking mode and continues normal operation by backtracking from the bad starting point until it locates the error. If none of the starting points is bad, the basic mode is entered and the normal backtracking is resumed from the failing external output.

Figure 5:
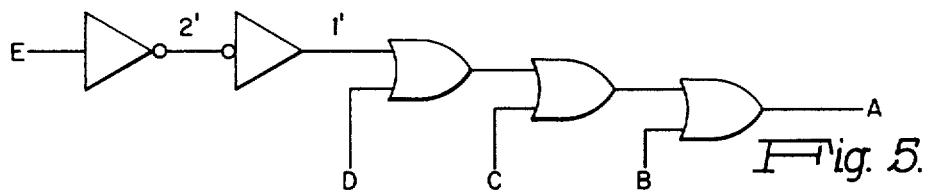

The power of this feature is illustrated in FIG. 5. A test program can be written so that a failure of external output "A" at the last test step can only occur if node 1' or 2' is faulty. IF, therefore, the UUT fails at such test step with "A" bad, the probe can first check node 1'. If it is bad, tracking continues from that point; otherwise, tracking continues from "A." If 1' is bad, the lookup has saved at least two probe points and possibly five.

The fault dictionary itself can be created, as before mentioned, either by simulating a good board with the appropriate fault inserted into the model, or by actual physical insertion of faults into a known good board. (See, also, Henckels and Haas, "Hardware Simulation or Software Simulation—A Comparison Between Two Techniques for Digital Testing", *IEEE Proceedings* of the 1975 ISCAS). The major limitation of the fault dictionary starting point approach, as before pointed out, is that in some cases the set of modelled (or inserted) faults does not adequately cover the set of all possible UUT failures. In this case, a failure on the UUT might have no corresponding entry in the fault dictionary or, worse yet, have an entry indicating a different fault.

Thus, the user need understand only the concepts of the fault dictionary and suggested starting points in order to use this feature. The designer, likewise, can implement this capability rather simply, determining only if any starting points exist; and, if so, if any are bad. Once it has determined where to start backtracking, the system slips back into the basic mode for the remainder of the probing sequence.

The invention also provides the option of introducing intelligent starting points generated by the user. Basically, these starting points function in a manner similar to that of fault dictionary starting points, having several advantages thereover. First, the user may decide that only a few selected failures warrant starting points, and does not want to create a full fault dictionary, much of the information of which is useless.

Figure 6:
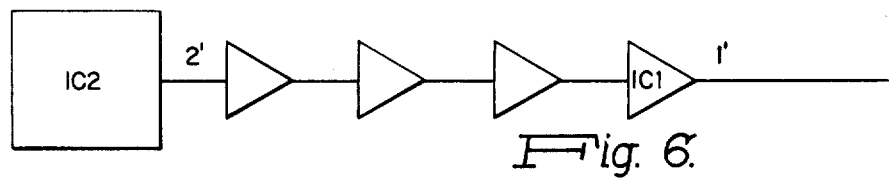

Secondly, the fault dictionary approach assumes all faults are equally probable. This is definitely not true of real UUTs as illustrated, for example, in the circuit involving IC2 and a plurality of successive amplifiers, FIG. 6. While the fault dictionary approach will select node 1' to be probed if certain error conditions hold, the user may prefer to look at node 2' first. The reason for this may be that a failure in the output of IC2 (a very fragile device easly damaged during insertion into the board) can cause the UUT to fail in the same manner as a failure at node 1'; and it may be ten times more likely to occur than an IC1 failure.

Thirdly, the user has a greater ability to see patterns and generate more complex matching criteria for error conditions. It is easy to implement matching techniques to allow the user to set checks for algebraic relations ($=, <, >, \neq, \geq, \leq$) between the first failing test of a UUT and a user-supplied test number, as well as performing set operations between the failing output vector and a user supplied vector: such as subset, superset, set equality, intersection, non-intersection.

In order to use this capability, the user need only learn how to create a text file containing commands which delineate starting point location and test step number and failing output vector matching information. The design implementation already contains the mechanism to handle starting points, so what is incrementally needed in the design is an ability to handle the increased matching capability. As a final note it should be mentioned that most implementations should allow the user-starting points to be used before the fault dictionary ones, since it is assumed the user has a good reason for what he is doing.

The method underlying the invention also provides the flexibility for option. This enables the user, at definable points during the probling sequence, to cause the tracking probe to look next at a user-desired node.

Figure 7:
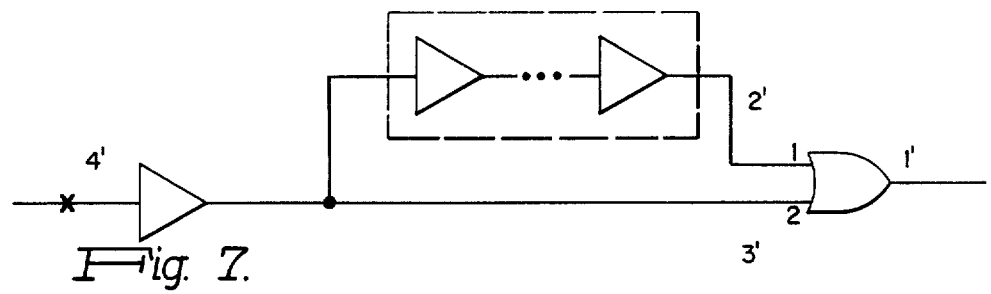

Thus, in the illustrative direct amplifier and parallel-path amplifier connections to the gate of FIG. 7, once the probe finds node 1' bad, following the computer's wisdom, it will always try to probe node 2'. The user, however, may realize that it is more effective to probe node 3' first; this, especially if node 4' is the faulty one.

Such "jumping" points are interpreted in a manner similar to starting points in that, if the suggested node is good, the system will first check for any additional jumping points, probing them until a bad node is detected or there are no more jumping points to check. In either case, the basic algorithm is re-entered until another "jumping" point is detected or a final diagnosis is made. In order to use this capability, the user must generate a text file of commands designating the point to jump from, the point to jump to, and the conditions under which to execute the jump (usually a comparison to the failing test step of the jump-from point). To implement jumping points, the designer need only determine if any jumping points exist from the node the probe is currently engaging, before allowing the algorithm to pick the next node to probe.

Still a further option of the invention enables on-line interaction by users who wish to rely on hunches or inspired guesses as to the node to probe next. In essence, what is provided is the "jumping" point capability, not automatically from a file, but rather "on demand".

Because of the principle of extensibility, what the designer wants to implement is a mechanism which allows the user to take control, probe a variable number of random points, and then return control to the base-tracking mechanism in a manner which allows the basic algorithm to make use of any information discovered. To do this, the system must merely remember where it was when the user took control; it must keep an up-to-date record of each bad node the user probed; and when the user returns control, it must continue from the last bad point the user found or from where it was interrupted if no useful information was gathered. Thus, to use this capability effectively, the user must be trained to request points to be probed in such a manner that the basic probe mechanism can logically begin tracking when control is returned.

In summary, therefore, the method, system, technique and inventive concept underlying the invention is thus readily implementable to those skilled in the art, as detailed in the above publications, and basically involves the discovery and application of the imbuing of intelligence as to probing areas, thus to enable increasingly complex and sophisticated logic circuit designs to be effectively troubleshot for defective circuits by new methods of rapid automated diagnosis of the analog/-digital and mixed logic circuit boards. In particular, the invention provides a powerful computer-guided probe system with highly advantageous time and cost-saving features, as follows:

(1) Fault-dictionary-based predictions of fault location, which permit the operatator to start probing automatically at or near the fault, rather than back from the edge connector. This technique combines the high resolution (single node) fault isolation capability of probing techniques with the high speed of fault-dictionary lookup methods. At the same time, it makes no assumptions as to the nature of faults in the circuit under test.

(2) User-programmed starting points for probing of specified failure modes. This allows the system to be optimized in its handling of a particular circuit's most common failure modes. In addition, it permits computer-guided probing of internal circuitry, based on the failure of analog tests.

(3) A fully interactive mode in which a skilled user can specify points in the circuit to probe, while allowing the system to analyze data from the probed nodes to make the final diagnosis; and automatic high and low threshold-voltage switching on the probe, depending on the type of logic being probed, allowing error-free probing of mixed logic circuit boards by unskilled operators.

The "intelligence" added to the probing in accordance with the philosophy of the invention—starting points, "jumping" points and on-line interaction—provides flexibility that allows the user to tailor the general purpose diagnostic testing system (such as described in the above CAPS VII manual and publications) to a specific testing situation, thus enabling a strong man-machine symbiosis. The analog failure which digital cause detection appears to be a unique feature, such that boards with both analog and digital components can be analyzed with diagnosis of digital causes of analog failures. In the event that one of the user-supplied starting points is bad, the probe algorithm previously described can start tracking the digital cause. If no digital problems are found, the system may automatically link to manual mode of operation which can provide a more comprehensive second-time-around analog test sequence (as described in said manual) since digital failure possibilities have been ruled out.

Further modifications will occur to those skilled in this art within the context of the apparatus and method of the invention that peripherally and interactively co-operates with mini-computer or similar systems. Such are considered to fall within the spirit and scope of the invention as defined in the appended claims,

What is claimed is:

1. A method for using an interactive computer system for testing circuit units with the aid of a guided probe comprising connecting a circuit unit under test into the system; subjecting the circuit unit under test to a set of tests; upon detecting a failure, predicting the most likely internal failing nodes of the circuit unit; indicating to an operator successive predicted internal failing nodes to be probed, in order to expedite failure diagnosis; probing the predicted internal failing nodes; and in the event none of the predicted internal failing nodes turns out to be a failing node, indicating successive nodes to be probed by back-tracking from an external output node of the circuit under test.

2. A method as claimed in claim 1 and in which the information as to the predicted internal failing nodes is stored in and retrieved from a partial fault dictionary.

3. A method as claimed in claim 1 and in which the information as to said predicted internal failing nodes is obtained by operator input.

4. A method as claimed in claim 1 and in which predetermined internal starting points of most likely failure on the unit are selected and successively indicated for probing to expedite failure diagnosis.

5. A method as claimed in claim 4 and in which the data from said predetermined point probing is analyzed for final failure diagnosis.

6. A method as claimed in claim 1 and in which predetermined internal jumping points on the unit are selected between which less likely failing nodes are situated and may be jumped over in favor of testing the more likely internal failing nodes of the unit, and said jumping points are indicated for probing to expedite failure diagnosis.

7. A method as claimed in claim 1 comprising automatically switching between high and low threshold voltages to be sensed during probing to conform to the type of circuit logic being probed.

8. An automatic on-line computer-aided fault diagnosis system for testing of circuit units comprising means for connecting a circuit unit under test into the system; means for applying a set of tests to the circuit unit and for detecting failures; means responsive to the detection of a failure for predicting the most likely internal failing nodes of the circuit unit; means for indicating to an operator successive predicted internal failing nodes; guided probe means for probing the predicted internal failing nodes; means responsive to the signal values on probed predicted internal failing nodes for detecting a failing node; and means for indicating successive nodes to be probed by back-tracking from an external output node of the circuit unit in the event that none of the predicted internal failing nodes turns out to be a failing node.

9. Apparatus as claimed in claim 8 and in which there is provided means for storing the information relating to said predicted internal failing nodes, and means for retrieving the same to indicate probe contact points in the circuit unit.

10. Apparatus as claimed in claim 9 and in which means is provided for indicating pre-selected starting points representing the most likely failing points.

11. Apparatus as claimed in claim 10 and in which means is provided for selecting said starting points from on-line fault simulation.

12. Apparatus as claimed in claim 9 and in which means is provided for indicating pre-selected jumping points selected between less likely failing nodes.

* * * * *